(12) United States Patent
Hamilton et al.

(10) Patent No.: US 8,461,698 B1
(45) Date of Patent: Jun. 11, 2013

(54) PCB EXTERNAL GROUND PLANE VIA CONDUCTIVE COATING

(75) Inventors: Brandon C. Hamilton, Marion, IA (US); Alan P. Boone, Swisher, IA (US); Guy N. Smith, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 133 days.

(21) Appl. No.: 12/892,617

(22) Filed: Sep. 28, 2010

(51) Int. Cl.
*H01L 23/28* (2006.01)
*H01L 23/34* (2006.01)
*H05K 1/00* (2006.01)

(52) U.S. Cl.
USPC .......... 257/787; 257/723; 257/E21.502; 257/E21.503; 257/E23.116; 361/751

(58) Field of Classification Search
USPC .......... 257/691, 723, 724, 787, E21.502, 257/E21.503, E23.13, E23.116
See application file for complete search history.

(56) References Cited

U.S. PATENT DOCUMENTS

| | | | | |
|---|---|---|---|---|
| 5,364,277 A * | 11/1994 | Crumly et al. | ............ | 439/67 |
| 5,696,196 A * | 12/1997 | DiLeo | ............ | 524/445 |
| 5,838,551 A * | 11/1998 | Chan | ............ | 361/818 |
| 5,939,783 A * | 8/1999 | Laine et al. | ............ | 257/702 |
| 5,968,600 A * | 10/1999 | DiLeo | ............ | 427/393.5 |
| 6,297,551 B1* | 10/2001 | Dudderar et al. | ............ | 257/723 |
| 6,420,208 B1* | 7/2002 | Pozder et al. | ............ | 438/106 |
| 7,905,992 B1* | 3/2011 | Misorski et al. | ............ | 204/196.18 |
| 2002/0129951 A1* | 9/2002 | Babb et al. | ............ | 174/35 R |
| 2002/0168798 A1* | 11/2002 | Glenn et al. | ............ | 438/110 |
| 2004/0056736 A1* | 3/2004 | Enokihara et al. | ............ | 333/202 |
| 2007/0284716 A1* | 12/2007 | Vindasius et al. | ............ | 257/686 |
| 2008/0142960 A1* | 6/2008 | Leal et al. | ............ | 257/723 |
| 2009/0016924 A1* | 1/2009 | Allen et al. | ............ | 419/9 |
| 2009/0136657 A1* | 5/2009 | Slafer | ............ | 427/124 |

* cited by examiner

*Primary Examiner* — Teresa M Arroyo
(74) *Attorney, Agent, or Firm* — Donna P. Suchy; Daniel M. Barbieri

(57) ABSTRACT

An integrated circuit assembly (ex.—a flip chip package, a wire bond chip package) is provided which includes a substrate (ex.—a printed circuit board) and a die assembly. The die assembly includes an integrated circuit chip which is connected to the printed circuit board. Further, an external dielectric layer (ex.—a solder mask layer) of the printed circuit board is at least substantially coated with a conductive coating (ex.—a low sintering temperature, nano-particle silver coating). The conductive coating is not in contact with the die assembly and/or passive electronics which are connected to the printed circuit board, however the conductive coating is electrically connected to the printed circuit board. The conductive coating provides (ex—acts as) an external ground plane for the printed circuit board.

6 Claims, 4 Drawing Sheets

PCB EXTERNAL GROUND PLANE VIA CONDUCTIVE COATING

FIELD OF THE INVENTION

The present invention relates to the field of substrates (ex.—printed circuit boards (PCBs)) and particularly to a system and method for providing a substrate (ex.—PCB) external ground plane via a conductive coating.

BACKGROUND OF THE INVENTION

When increasing the circuit density of a multi-layered Printed Circuit Board (PCB), significant demand for space is placed upon each of the uppermost layers of the panelized board (ex.—the PCB). Adding ground layers and/or incorporating vias into (ex.—within) the PCB are solutions which are currently utilized for resolving routing density issues of PCBs. However, considerable sacrifices in cost and reliability are associated with the above-referenced currently utilized solutions.

Thus, it would be desirable to provide a solution which addresses the shortcomings of currently available solutions.

SUMMARY OF THE INVENTION

Accordingly, an embodiment of the present disclosure is directed to an integrated circuit assembly, including: a substrate, the substrate including an external dielectric layer; a die assembly, the die assembly being connected to the substrate, the die assembly including an integrated circuit chip, the integrated circuit chip having a first surface and a second surface, the first surface being disposed generally opposite the second surface, the first surface being oriented away from the substrate, the second surface being oriented towards the substrate, the second surface of the integrated circuit chip having configured thereon a plurality of solder bumps, the integrated circuit chip being connected to the substrate via the plurality of solder bumps; and a conductive coating, the conductive coating at least substantially covering the external dielectric layer of the substrate, wherein the conductive coating forms an external ground plane of the substrate.

An additional embodiment of the present disclosure is directed to an integrated circuit assembly, including: a substrate, the substrate including an external dielectric layer; a die assembly, the die assembly being connected to the substrate, the die assembly including an integrated circuit chip, the integrated circuit chip being connected to the substrate via at least one bonding wire; an underfill, the underfill being configured between the die assembly and the substrate; and a conductive coating, the conductive coating at least substantially covering the external dielectric layer of the substrate, wherein the conductive coating forms an external ground plane of the substrate.

A further embodiment of the present disclosure is directed to a method for producing an integrated circuit package, including: providing a substrate; orienting a die assembly upon the substrate so that solder bumps of the die assembly are contacting the substrate; bonding the solder bumps of the die assembly to the substrate; providing an underfill material between the die assembly and the substrate; and applying a conductive coating to an external dielectric layer of the substrate, wherein the conductive coating provides an external ground plane for the integrated circuit package.

An additional embodiment of the present disclosure is directed to a method for producing an integrated circuit package, including: providing a substrate; wire bonding a die assembly to the substrate; providing an underfill material between the die assembly and the substrate; and applying a conductive coating to an external dielectric layer of the substrate, wherein the conductive coating provides an external ground plane for the integrated circuit package.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
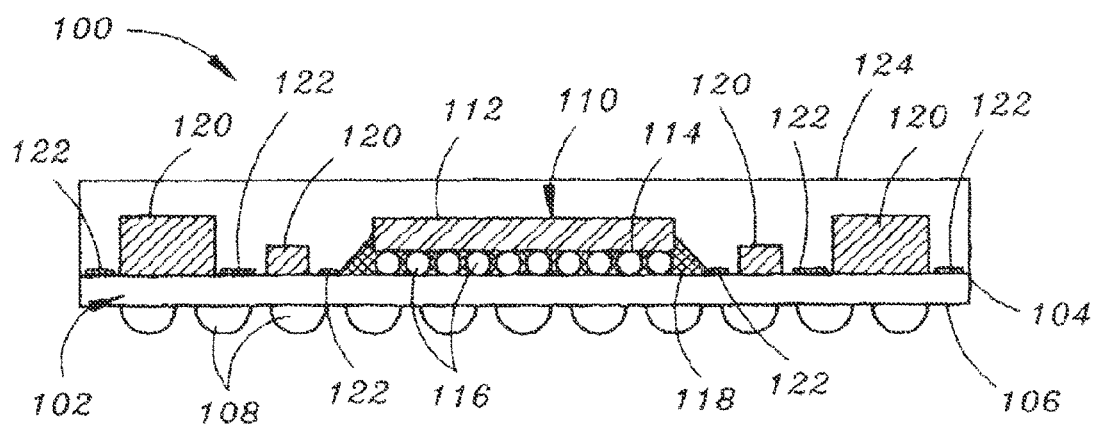
FIG. 1 is a view of a flip chip package in accordance with an exemplary embodiment of the present disclosure.
Figure 2:
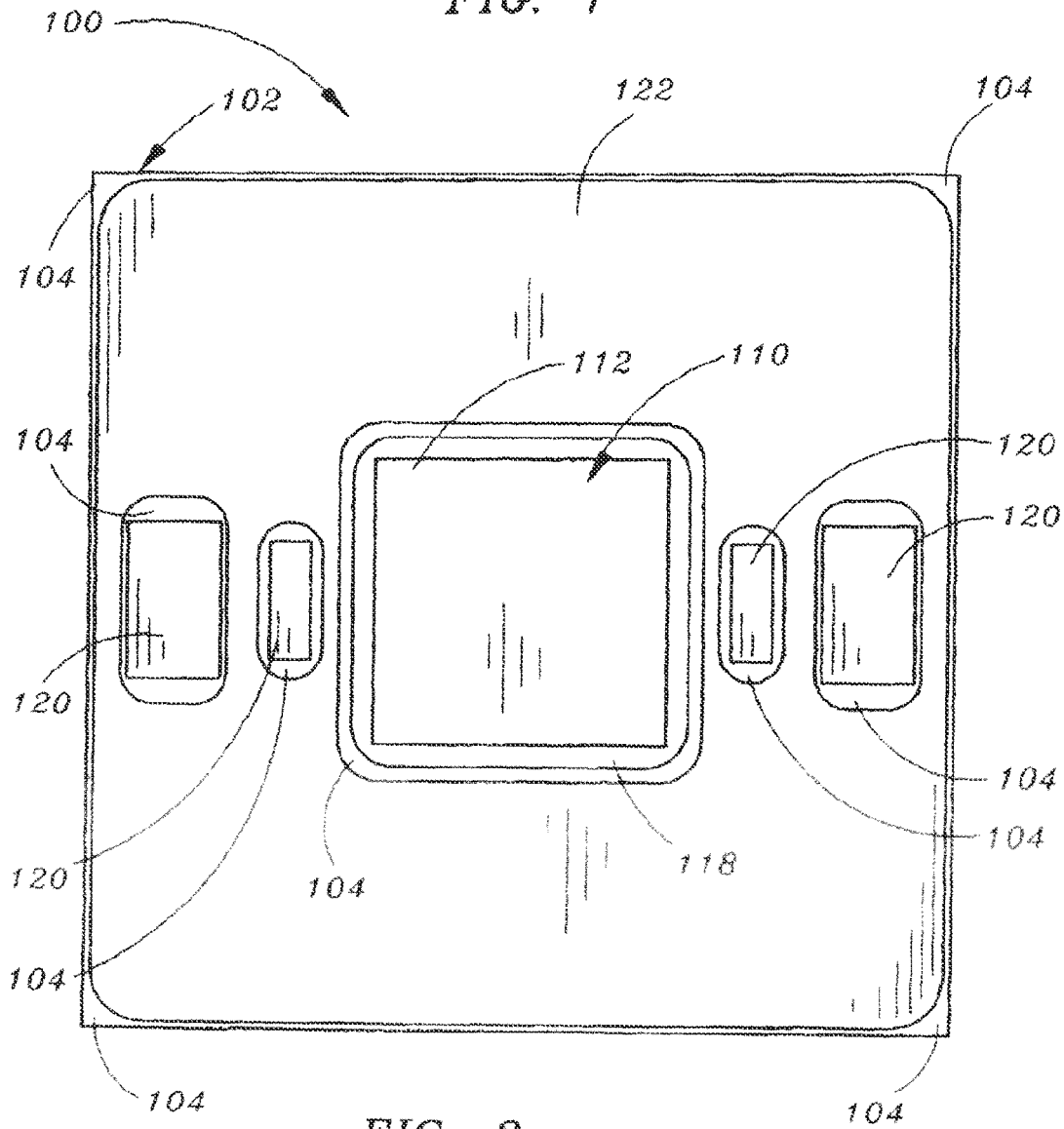
FIG. 2 is a top plan view of the flip chip package of FIG. 1, except that the encapsulant has been removed for clarity.

Referring generally to FIGS. 1 and 2, an integrated circuit assembly (exs.—an integrated circuit (IC) package, a silicon-to-silicon chip scale package, a wafer-level chip scale package) in accordance with an exemplary embodiment of the present disclosure is shown. In exemplary embodiments of the present disclosure, the integrated circuit package 100 is a flip chip package (as shown in FIGS. 1 and 2). In further embodiments of the present disclosure, the integrated circuit package may be a Ball Grid Array (BGA) assembly. In further embodiments of the present disclosure, the integrated circuit package 100 includes external circuitry 102. For example, the external circuitry 102 may be substrate (ex.—a Printed Circuit Board (PCB)) 102. Other examples of substrates 102 which may be implemented include but are not limited to ceramic substrates, glass-ceramic substrates, pliable (ex.—flex) substrates, organic substrates, silicon substrates. In still further embodiments of the present disclosure, the PCB 102 includes a first surface (ex.—a top surface) 104 and a second surface (ex.—a bottom surface) 106. For instance, the first (ex.—top) surface 104 may be a first external dielectric layer (ex.—a first solder mask layer, a first layer of solder mask, a first solder mask surface, a top solder mask surface) 104 () of the PCB 102, and the second (ex.—bottom) surface 106 may be a second external dielectric layer (ex.—a second solder mask layer, a second layer of solder mask, a second solder mask surface, a bottom solder mask surface) 106 of the PCB 102. Some examples of solder mask which may be used in (ex.—which may form) the solder mask layers include epoxy liquid, Liquid Photoimageable Solder Mask (LPSM), and Dry Film type Solder Mask (DFSM).

In current exemplary embodiments of the present disclosure, the PCB 102 includes a plurality of solder bumps 108 (ex.—solder dots, solder balls, solder spheres). For instance, the solder spheres 108 may be connected (ex.—bonded) to the substrate (ex.—PCB) 102 via a first (ex.—bottom) interconnect layer of the PCB 102. In further embodiments of the present disclosure, the IC package 100 further includes a die assembly (ex.—die, integrated circuit, IC chip) 110. In exemplary embodiments of the present disclosure, the IC chip 110 is connected to the substrate (ex.—PCB) 102 via a second (ex.—top) interconnect layer of the PCB 102. In further embodiments of the present disclosure, the IC chip 110 includes a first surface 112 and a second surface 114, the second surface 114 being disposed generally opposite the first surface 112.

In exemplary embodiments of the present disclosure, a plurality of solder bumps (ex.—solder dots, solder spheres) 116 are formed or configured upon the second surface 114 of the IC chip 110. In further embodiments of the present disclosure, the solder bumps 116 and the second surface 114 of the IC chip 110 are oriented towards the first (ex.—top) external dielectric layer 104 of the PCB 102, while the first surface of the IC chip 110 is oriented away from the PCB 102 (and away from the first (ex.—top) external dielectric layer 104 of the PCB 102). In current exemplary embodiments of the present disclosure, the second (ex.—bottom) external dielectric layer 106 of the PCB 102 is oriented away from the IC chip 110. In further embodiments of the present disclosure, the IC chip 110 is connected (via the solder bumps 116) to the PCB 102 (ex.—is connected to the top interconnect layer of the PCB 102). In still further embodiments of the present disclosure, an underfill (ex.—an electrically insulating adhesive) 118 is configured between the IC chip 110 and the PCB 102, the underfill 118 connecting the IC chip to the top external dielectric layer (ex.—top solder mask layer) 104.

In current exemplary embodiments of the present disclosure, the IC package 100 further includes a plurality of electronic components 120 (ex.—passives) which are connected to the top interconnect layer of the PCB 102. In further embodiments of the present disclosure, the IC package 100 further includes a conductive coating 122. The conductive coating 122 (ex.—conductive coating layer 122) is configured upon (ex.—at least substantially covers or coats) the top external dielectric layer (ex.—top solder mask layer) 104 of the PCB 102 (as shown in FIGS. 1 and 2). In exemplary embodiments of the present disclosure, the conductive coating 122 is a low sintering temperature coating. In further embodiments of the present disclosure, the conductive coating is a nano-particle coating. For example, the conductive coating 122 may be a low sintering temperature, nano-particle silver coating. In further embodiments of the present disclosure, the conductive coating 122 may be formed of organic materials, metallic materials and/or ceramic materials. For instance, the conductive coating 122 may be a nano-particle gold (Au) coating (ex.—nano-gold coating), a nano-particle silver (Ag) coating, a nano-particle copper (Cu) coating, a nano-particle nickel (Ni) coating, a nano-particle Indium Tin Oxide (ITO) coating, and/or any one or more of a number of other various commercially-available nano-particle coatings, paints and/or inks. In further embodiments of the present disclosure, the conductive coating 122 may be formed of a conductive organic polymer, such as polyphenylene sulfide, polyaniline, polypyrole, polyacetylene, Poly (3,4-ethylenedioxythiophene) poly(styrenesulfonate) (PEDOT-PSS) and/or any number of metallic-filled organics, such as a silver-filled epoxy adhesive. In further embodiments of the present disclosure, the conductive coating 122 may be achieved via vapor deposition of aluminum, tin, gold, silver, solder, lead and/or the like.

In exemplary embodiments of the present disclosure, the layer of conductive coating 122 provides (ex.—forms, acts as) an external ground plane for the PCB 102. As mentioned above, the conductive coating 122 (ex.—conductive coating layer 122) is configured upon (ex.—at least substantially covers or coats) the top external dielectric layer (ex.—top solder mask layer) 104 of the PCB 102 (as shown in FIGS. 1 and 2). However (as shown in FIG. 2), in further embodiments of the present disclosure, the conductive coating 122 is not in contact with (ex.—does not cover) the electronic components (ex.—passives) 120 or the die assembly 110. The conductive coating 122 is electrically connected with the substrate (ex.—PCB) 102.

In further embodiments of the present disclosure, the IC package 100 further includes an encapsulant (ex.—encapsulant layer) 124 (as shown in FIG. 1). The encapsulant layer 124 is formed over the conductive coating layer 122, the passive components 120 and/or the die assembly 110. In exemplary embodiments of the present disclosure, the encapsulant 124 is configured for providing mechanical integrity for the IC package 100.

Figure 3:
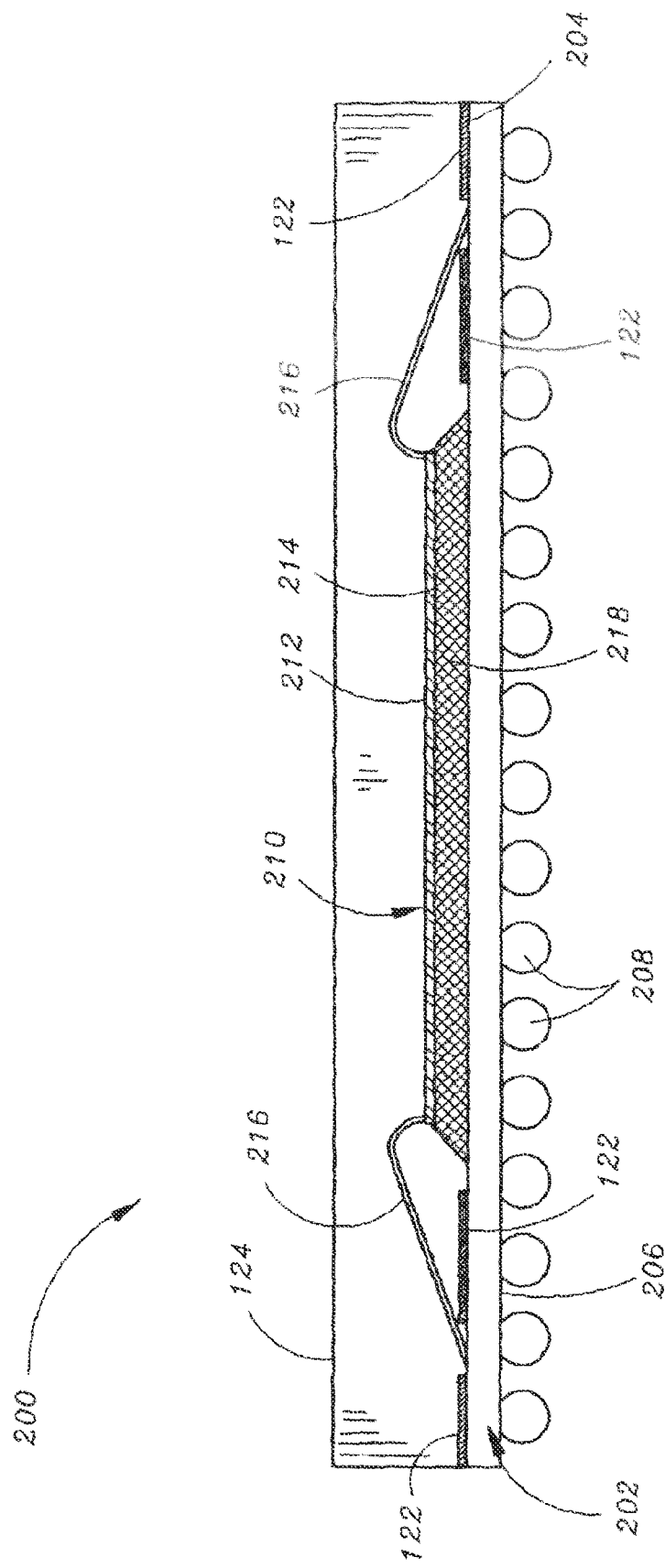
FIG. 3 is a view of a wire bond chip package in accordance with an exemplary embodiment of the present disclosure.

Referring to FIG. 3, an integrated circuit assembly (ex.—an integrated circuit (IC) package) in accordance with a further exemplary embodiment of the present disclosure is shown. In the embodiment shown in FIG. 3, the integrated circuit package 200 is a wire bond chip package. In further embodiments of the present disclosure, the integrated circuit package 200 includes external circuitry, such as a substrate (ex.—a Printed Circuit Board (PCB)) 202. In still further embodiments of the present disclosure, the PCB 202 includes a first surface (ex.—a top surface) 204 and a second surface (ex.—a bottom surface) 206. For instance, the first (ex.—top) surface 204 may be a first external dielectric layer (ex. —a first solder mask layer) 204 of the substrate (ex.—PCB) 202, and the second (ex.—bottom) surface 206 may be a second external dielectric layer (ex.—a second solder mask layer) 206 of the substrate (ex.—PCB) 202.

In current exemplary embodiments of the present disclosure, the PCB 202 includes a plurality of solder bumps 208 (ex.—solder dots, solder spheres). For instance, the solder spheres 208 may be connected to the PCB 202 (ex.—may be connected to a first (ex.—bottom) interconnect layer of the PCB). In further embodiments of the present disclosure, the IC package 200 further includes a die assembly (ex.—die, integrated circuit, IC chip) 210. In exemplary embodiments of the present disclosure, the IC chip 210 is connected to the substrate (ex.—is connected to a second (ex.—top) interconnect layer of the PCB 202). In further embodiments of the present disclosure, the IC chip 210 includes a first surface 212 and a second surface 214, the second surface 214 being disposed generally opposite the first surface 212.

In exemplary embodiments of the present disclosure, a plurality of bonding wires 216 are connected (ex.—bonded) to the IC chip 210. In further embodiments of the present disclosure, the second surface 214 of the IC chip 210 is oriented towards the first (ex.—top) external dielectric layer (ex.—top solder mask layer) 204 of the substrate (ex.—PCB) 202, while the first surface of the IC chip 210 is oriented away from the top external dielectric layer (ex.—top solder mask layer) 204 of the PCB 202. In current exemplary embodiments of the present disclosure, the second (ex.—bottom) external dielectric layer (ex.—bottom solder mask layer) 206 of the PCB 202 is oriented away from the IC chip 210. In further embodiments of the present disclosure, the IC chip 210 is connected (ex.—wire-bonded via the bonding wires 216) to the substrate 202 (ex.—to the top interconnect layer of the PCB 202). In still further embodiments of the present disclosure, an underfill (ex.—an electrically insulating adhesive) 218 is configured between the IC chip 210 and the PCB 202, the underfill 218 connecting the IC chip 210 to the top external dielectric layer (ex.—top solder mask layer) 204.

In current exemplary embodiments of the present disclosure, the IC package 200 further includes a conductive coating 122. The conductive coating 122 (ex.—conductive coating layer 122) is configured upon (ex.—at least substantially covers or coats) the top external dielectric layer (ex.—top solder mask layer) 204 of the PCB 202 (as shown in FIG. 3). In exemplary embodiments of the present disclosure, the conductive coating 122 is a low sintering temperature coating. In further embodiments of the present disclosure, the conductive coating is a nano-particle coating. For example, the conductive coating 122 may be a low sintering temperature, nano-particle silver coating. In further embodiments of the present disclosure, the conductive coating 122 may be formed of organic materials, metallic materials and/or ceramic materials. For instance, the conductive coating 122 may be a nano-particle gold (Au) coating (ex.—nano-gold coating), a nano-particle silver (Ag) coating, a nano-particle copper (Cu) coating, a nano-particle nickel (Ni) coating, a nano-particle Indium Tin Oxide (ITO) coating, and/or any one or more of a number of other various commercially-available nano-particle coatings, paints and/or inks. In further embodiments of the present disclosure, the conductive coating 122 may be formed of a conductive organic polymer, such as polyphenylene sulfide, polyaniline, polypyrole, polyacetylene, Poly(3,4-ethylenedioxythiophene) poly(styrene-sulfonate) (PEDOT-PSS) and/or any number of metallic-filled organics, such as a silver-filled epoxy adhesive.

In exemplary embodiments of the present disclosure, the layer of conductive coating 122 provides (ex.—forms, acts as) an external ground plane for the substrate (ex.—PCB) 202 of the wire bond chip package 200. As mentioned above, the conductive coating 122 (ex.—conductive coating layer 122) is configured upon (ex.—at least substantially covers or coats) the top external dielectric layer (ex.—top solder mask layer) 204 of the PCB 202 (as shown in FIG. 3). However, in further embodiments of the present disclosure, the conductive coating 122 is not in contact with (ex.—does not cover) the die assembly 210, the bonding wires 216, and/or bonding wire-PCB contact areas (ex.—bond pads) on the top surface 204 of the of the PCB 202. The conductive coating 122 is electrically connected with the substrate (ex.—PCB) 202.

In further embodiments of the present disclosure, the IC package 200 further includes an encapsulant (ex.—encapsulant layer) 124 (as shown in FIG. 3). The encapsulant layer 124 is formed over the conductive coating layer 122, the bonding wires 216 and/or the die assembly 210. In exemplary embodiments of the present disclosure, the encapsulant 124 is configured for providing mechanical integrity for the IC package 200.

Figure 4:
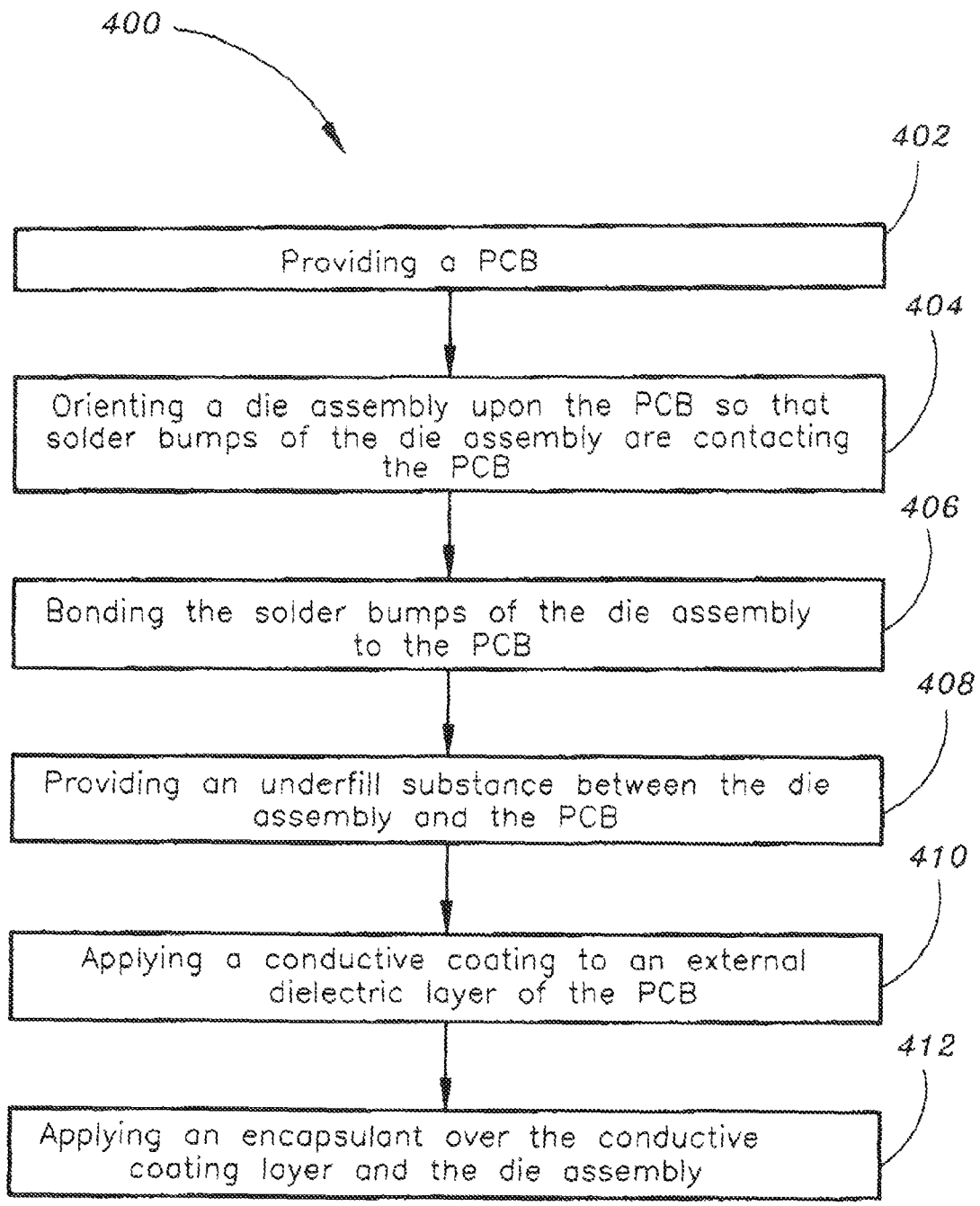
FIG. 4 is a flowchart illustrating a method for producing a flip chip package in accordance with an exemplary embodiment of the present disclosure.

Referring to FIG. 4, a method for producing an integrated circuit package (ex.—a flip chip package) is shown. In an exemplary embodiment of the present disclosure, the method 400 includes the step of providing a substrate (ex.—a PCB) 402. The method 400 further includes the step of orienting a die assembly upon the PCB so that solder bumps (ex.—solder spheres) of the die assembly are contacting the PCB 404. The method 400 further includes the step of bonding the solder bumps of the die assembly to the PCB 406. For example, the solder bumps of the die assembly may be bonded to the PCB via reflow solder process, hot air re-flow, or the like. In embodiments in which the die assembly includes gold stud bumps or copper stud bumps rather than solder bumps, the stud bumps of the die assembly may be bonded to the PCB via thermosonic bonding processes, thermocompression bonding processes, and/or the like.

In exemplary embodiments of the present disclosure, the method 400 further includes the step of providing an underfill material (exs.—an underfill, an underfill substance) between the die assembly and the printed circuit board 408. For instance, the die assembly may be underfilled with an underfill material, such as an electrically insulating adhesive. In further embodiments of the present disclosure, the method 400 further includes applying a conductive coating to an external dielectric layer (ex.—to a solder mask layer) of the substrate (ex.—the PCB) 410. For example, the conductive coating may be a low sintering temperature nano-particle silver coating. In current exemplary embodiments of the present disclosure, the conductive coating may be applied via painting, spraying, depositing, vapor deposition (ex.—chemical, physical, pulsed laser, etc.) and/or dispensing via traditional automated methods. In further embodiments of the present disclosure, the conductive coating does not contact the die and/or passive components connected to the PCB. However, the conductive coating is in electrical contact with (ex.—is electrically connected to) the PCB. Precaution is taken to avoid overspray onto the die and/or onto passive components connected to the, since said overspray of the conductive coating may cause a short. The conductive coating layer provides an external ground plane for the PCB.

In current exemplary embodiments of the present disclosure, the method 400 further includes applying an encapsulant over the conductive coating layer and the die assembly 412. For instance, the encapsulant may promote mechanical integrity of the flip chip package.

Figure 5:
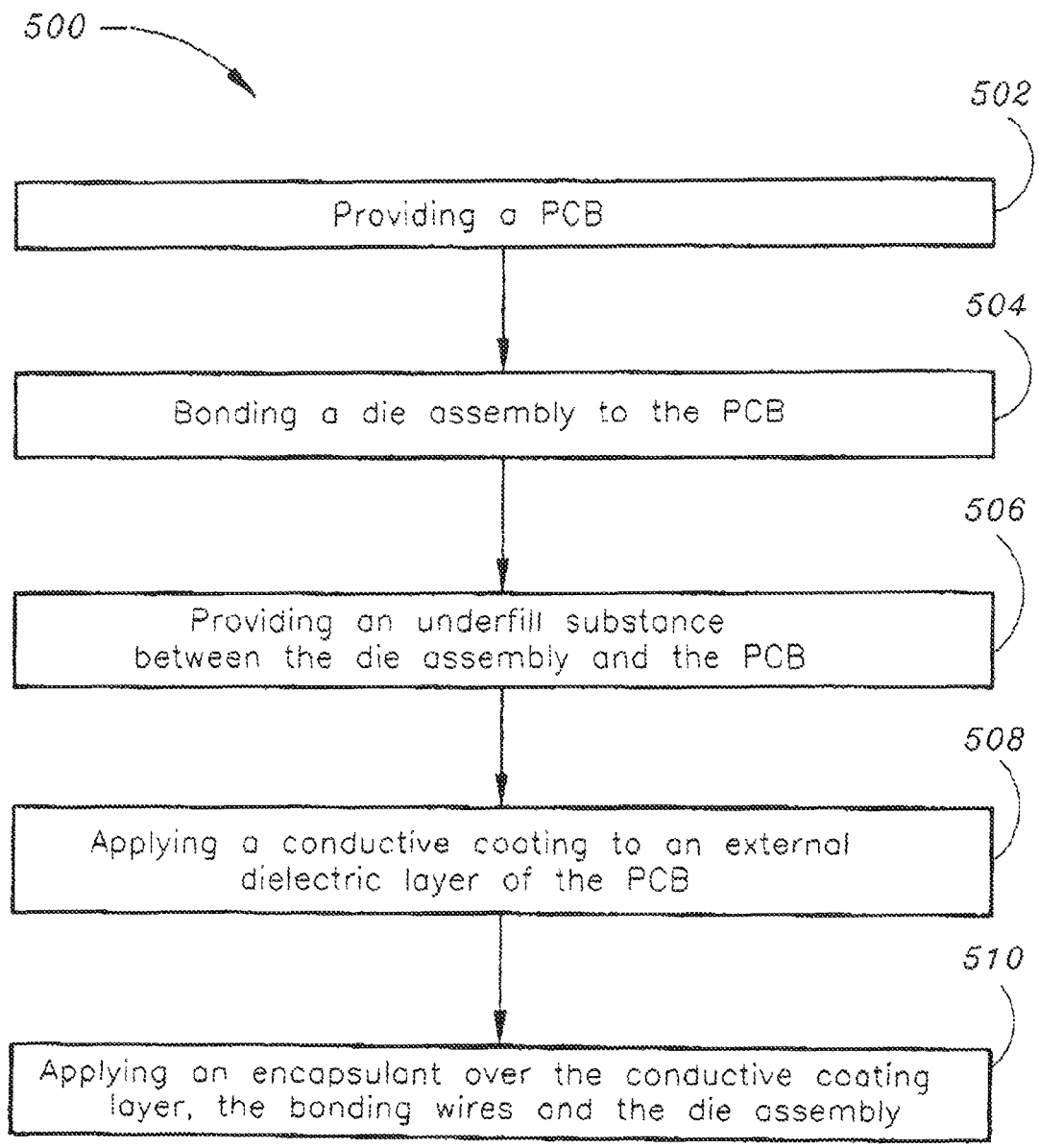
FIG. 5 is a flowchart illustrating a method for producing a wire bond chip package in accordance with an exemplary embodiment of the present disclosure.

Referring to FIG. 5, a method for producing an integrated circuit package (ex.—a wire bond chip package) is shown. In an exemplary embodiment of the present disclosure, the method 500 includes the step of providing a substrate (ex.—a PCB) 502. The method 500 further includes the step of bonding (ex—wire bonding) a die assembly to the PCB 504. For example, bonding wires may be connected to the die assembly and to the PCB for wire bonding the die assembly to the PCB.

In exemplary embodiments of the present disclosure, the method 500 further includes the step of providing an underfill material (exs.—an underfill, an underfill substance) between the die assembly and the printed circuit board 506. For instance, the die assembly may be underfilled with an underfill material, such as an electrically insulating adhesive. In further embodiments of the present disclosure, the method 500 further includes applying a conductive coating to an external dielectric layer (ex—a solder mask layer) of the substrate 508. For example, the conductive coating may be a low sintering temperature nano-particle silver coating. In current exemplary embodiments of the present disclosure, the conductive coating may be applied via painting, spraying, screening, jetting, dipping, depositing, and/or dispensing via traditional automated methods. In further embodiments of the present disclosure, the conductive coating does not contact the die assembly. However, the conductive coating is in electrical contact with (ex.—is electrically connected to) the PCB. Precaution is taken to avoid overspray onto the die assembly, since said overspray of the conductive coating may cause a short. The conductive coating layer provides an external ground plane for the PCB.

In further embodiments of the present disclosure, the method 500 further includes applying an encapsulant over the conductive coating layer, the bonding wires and the die assembly 510. For instance, the encapsulant may promote mechanical integrity of the flip chip package.

The external dielectric layer(s) (104, 106, 204, 206) of the substrate (102, 202) may provide electrical isolation between the conductive coating 122 and top layer circuit routing of the substrate (102, 202)

By implementing a conductive coating applied over (ex.—applied to) an external dielectric layer (ex.—a solder mask layer) of a substrate (ex.—PCB) to provide an external ground plane for the PCB, the embodiments disclosed herein reduce or eliminate the need to incorporate additional ground layers and vias within the PCB, consequently promoting reduced induction, increased circuit density, lower PCB costs, improved routing density and improved reliability.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An integrated circuit assembly, comprising:
   a substrate, the substrate including a top layer circuit routing and an external dielectric layer on one of a top surface and a bottom surface, the external dielectric layer made of a solder mask;
   a die assembly, the die assembly being connected to the substrate, the die assembly including an integrated circuit chip, the integrated circuit chip having a first surface and a second surface, the first surface being disposed generally opposite the second surface, the first surface being oriented away from the substrate, the second surface being oriented towards the substrate, the second surface of the integrated circuit chip having configured thereon a plurality of solder bumps, the integrated circuit chip being connected to the substrate via the plurality of solder bumps, and an underfill configured between the integrated circuit chip and the substrate; and
   a conductive coating, the conductive coating at least substantially covering the external dielectric layer of the substrate and contacting the underfill,
   wherein the conductive coating forms an external ground plane of the substrate, the conductive coating including at least one of a nano-particle coating, a conductive organic polymer, a metallic-filled organic, or a ceramic material, the external dielectric layer configured to provide electrical isolation between the conductive coating and the top layer circuit routing.

2. An integrated circuit assembly as claimed in claim 1, further comprising:
   a plurality of passive electronic components, said passive electronic components being connected to the substrate.

3. An integrated circuit assembly as claimed in claim 1, further comprising:
   an encapsulant, said encapsulant being configured over the passive electronic components, the conductive coating, and the die assembly.

4. An integrated circuit assembly as claimed in claim 1, wherein the nano-particle coating is a nano-particle silver coating.

5. An integrated circuit assembly, comprising:
   a substrate, the substrate including a top layer circuit routing and an external dielectric layer on one of a top surface and a bottom surface, the external dielectric layer made of a solder mask;
   a die assembly, the die assembly being connected to the substrate, the die assembly including an integrated circuit chip, the integrated circuit chip being connected to the substrate via at least one bonding wire;
   an underfill, the underfill being configured between the integrated circuit chip and the substrate; and
   a conductive coating, the conductive coating at least substantially covering the external dielectric layer of the substrate,
   wherein the conductive coating forms an external ground plane of the substrate, the conductive coating includes a nano-particle coating, a conductive organic polymer, metallic-filled organic, or a ceramic material, the external dielectric layer configured to provide electrical isolation between the conductive coating and the top layer circuit routing.

6. An integrated circuit assembly as claimed in claim 5, further comprising:
   an encapsulant, said encapsulant being configured over the conductive coating, the bonding wires and the die assembly.

* * * * *